(12) United States Patent
Jung

(10) Patent No.: US 7,563,712 B2
(45) Date of Patent: Jul. 21, 2009

(54) METHOD OF FORMING MICRO PATTERN IN SEMICONDUCTOR DEVICE

(75) Inventor: Woo Yung Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 2 days.

(21) Appl. No.: 11/765,540

(22) Filed: Jun. 20, 2007

(65) Prior Publication Data
US 2008/0233729 A1    Sep. 25, 2008

(30) Foreign Application Priority Data
May 23, 2007    (KR) ...................... 10-2007-0028783

(51) Int. Cl.
*H01L 21/44*   (2006.01)
(52) U.S. Cl. ................... 438/671; 438/551; 438/552; 438/736
(58) Field of Classification Search ......... 438/445–448, 438/551–556, 671–673, 736–739, 618–624, 438/637–638, 700
See application file for complete search history.

(56) References Cited

U.S. PATENT DOCUMENTS

2006/0273456 A1    12/2006    Sant et al.
2007/0049011 A1    3/2007    Tran
2008/0081461 A1*    4/2008    Lee et al. .................... 438/637

FOREIGN PATENT DOCUMENTS

| KR | 10-0608343 | 7/2006 |
| KR | 100640657 B1 | 10/2006 |
| KR | 1020060110706 A | 10/2006 |
| KR | 1020060129412 A | 12/2006 |

* cited by examiner

*Primary Examiner*—Dung A. Le
(74) *Attorney, Agent, or Firm*—Townsend and Townsend and Crew LLP

(57) ABSTRACT

A method of forming a fine pattern in a semiconductor device includes forming an target layer, a hard mask layer and first sacrificial patterns on a semiconductor substrate; forming an insulating layer and a second sacrificial layer on the hard mask layer and the first sacrificial patterns; performing the first etch process so as to allow the second sacrificial layer remain on the insulating layer between the first sacrificial patterns for forming second sacrificial patterns; removing the insulating layer placed on the first sacrificial patterns and between the first and second sacrificial patterns; etch the hard mask layer through the second etch process utilizing the first and second sacrificial patterns as the etch mask to form a mask pattern; and etch the target layer through the third etch process utilizing the hard mask pattern as the etch mask.

17 Claims, 7 Drawing Sheets

METHOD OF FORMING MICRO PATTERN IN SEMICONDUCTOR DEVICE

CROSS-REFERENCE TO RELATED APPLICATIONS

This application claims priority from Korean Patent Application No. 2007-28783, filed on Mar. 23, 2007, the contents of which are incorporated herein by reference in its entirety.

BACKGROUND OF THE INVENTION

The present invention relates to a semiconductor device, and more particularly to a method of forming a micro pattern in a semiconductor device which is finer than the resolution of the exposure equipment.

As a semiconductor device becomes more integrated, a required minimum line width becomes reduced. However, the development of the exposure equipment for realizing a required fine line width of such a high-integrated device is not satisfied. In particular, in a case where the fine line width which of less than 50 nm needs to be obtained by conventional exposure equipment, the resolution ability of the conventional exposure equipment is limited.

SUMMARY OF THE INVENTION

The present invention relates to a method of forming a micro pattern in a semiconductor device which is finer than a resolution of the exposure equipment.

The method of forming a micro pattern in a semiconductor device according to the first embodiment of the present invention comprises the steps of forming an target layer, a hard mask layer and first sacrificial patterns on a semiconductor substrate; forming an insulating layer and a second sacrificial layer on the hard mask layer and the first sacrificial patterns; performing the first etch process so as to allow the second sacrificial layer remain on the insulating layer between the first sacrificial patterns for forming second sacrificial patterns; removing the insulating layer placed on the first sacrificial patterns and between the first and second sacrificial patterns; etching the hard mask layer through the second etch process utilizing the first and second sacrificial patterns as the etch mask to form a mask pattern; and etching the target layer through the third etch process utilizing the hard mask pattern as the etch mask.

In the above method, the target layer is formed of an insulating layer, a conductive layer or an inter-insulating layer. The hard mask layer has a stack structure consisting of an amorphous carbon layer and a silicon oxynitride (SiON) layer.

The first sacrificial layer is formed of a polysilicon layer, a silicon oxide ($SiO_2$) layer, a tungsten layer or a SOG (spin on glass) layer. The first sacrificial pattern has a critical dimension that is approximately half of a pitch between the micro patterns formed through the final process. The insulating layer is formed from amorphous carbon layer, silicon oxide ($SiO_2$), a tungsten (W) or a SOG (spin on glass).

The insulating layer is formed from material having an etch selectivity with respect to material utilized for forming the second sacrificial layer and the first sacrificial pattern. The insulating layer deposited on a side surface of the first sacrificial pattern has a thickness that is approximately half of a pitch between the micro patterns formed through the final process.

The second sacrificial layer is formed from conductive material or insulative material. The second sacrificial layer is formed of a SOG (spin on glass) layer, an organic bottom anti-reflective coating containing silicon such as a multi-functional hard mask layer, a silicon oxide ($SiO_2$) layer, a tungsten (W) layer or a polysilicon layer. If SOG is used for forming the second sacrificial layer, a heat treatment process is further performed after a deposition process.

The second sacrificial layer is etched through the etchback process. The second sacrificial pattern is remained such that the second sacrificial pattern is leveled with the first sacrificial pattern when the second etch process is performed. The insulating layer is removed through a dry etch process utilizing oxygen ($O_2$) plasma. The insulating layer has an etch selectivity with respect to material utilized for forming the first sacrificial pattern and the second sacrificial layer when the first etch process and the process for removing the insulating layer are performed. The second sacrificial pattern is formed between the first sacrificial patterns. The second etch process is a dry etch process.

The method of forming a micro pattern in a semiconductor device according to the second embodiment of the present invention comprises the steps of forming an target layer, a hard mask layer and first sacrificial patterns on a semiconductor substrate on which a cell gate region, a selective transistor region and a periphery circuit region are defined; forming an insulating layer and a second sacrificial layer on the hard mask layer and the first sacrificial patterns; removing the insulating layer and the second sacrificial layer formed in the selective transistor region and the periphery circuit region; performing the first etch process so as to allow the second sacrificial layer formed in the cell gate region remain on the insulating layer between the first sacrificial patterns for forming second sacrificial patterns; removing the insulating layer placed on the first sacrificial patterns and between the first and second sacrificial patterns in the cell gate region; etch the hard mask layer through the second etch process utilizing the first and second sacrificial patterns as the etch mask to form a mask pattern; and etch the target layer through the third etch process utilizing the hard mask pattern as the etch mask.

The target layer is formed of a tungsten silicide ($WSi_x$) layer. The stack structure consisting of a tunnel insulating layer, a first conductive layer for a floating gate, a dielectric layer and a second conductive layer for a control gate is formed between the target layer and the semiconductor substrate. The hard mask layer has a stack structure consisting of an amorphous carbon layer and a silicon oxynitride (SiON) layer. The first sacrificial layer is formed of a polysilicon layer, a silicon oxide ($SiO_2$,) layer, a tungsten layer or a SOG (spin on glass) layer. The first sacrificial pattern has a critical dimension that is approximately half of a pitch between the micro patterns formed through the final process.

The insulating layer is formed from amorphous carbon layer, silicon oxide ($SiO_2$), a tungsten (W) or a SOG (spin on glass). The insulating layer is formed from material having an etch selectivity with respect to material utilized for forming the second sacrificial layer and the first sacrificial pattern. The insulating layer deposited on a side surface of the first sacrificial pattern has a thickness that is approximately half of a pitch between the micro patterns formed through the final process.

The second sacrificial layer is formed from conductive material or insulative material. The second sacrificial layer is formed of a SOG (spin on glass) layer, an organic bottom anti-reflective coating containing silicon such as a multi-functional hard mask layer, a silicon oxide ($SiO_2$) layer, a tungsten (W) layer or a polysilicon layer. A heat treatment process is further performed after forming the deposition process if SOG material is utilized. The second sacrificial layer is removed through a dry etch process utilizing the insulating layer as an etch stop layer when a process for removing the second sacrificial layer formed in the selective transistor region and the peripheral region is performed. The insulating layer is removed through a dry etch process utilizing the hard mask layer as an etch stop layer when a process for removing the insulating layer formed in the selective transistor region and the peripheral region is performed. The second sacrificial layer remained in the selective transistor region is removed when a process for removing the second sacrificial layer remained in the cell gate region is performed. The second sacrificial layer remained in the selective transistor region is removed through the etch-back process.

The second sacrificial pattern is leveled with the first sacrificial pattern when the first etch process is performed. The insulating layer has an etch selectivity with respect to material utilized for forming the first sacrificial pattern and the second sacrificial layer when the first etch process and the process for removing the insulating layer are performed. The insulating layer remained in the selective transistor region is removed when a process for removing the insulating layer remained in the cell gate region is performed. The insulating layer remained on the selective transistor region is removed through a dry etchetch process utilizing oxygen ($O_2$) plasma. The second sacrificial pattern is formed between the first sacrificial patterns. The second etch process is a dry etch process. The tunnel insulating layer, the first conductive layer for the floating gate, the dielectric layer and the second conductive layer for the control gate formed between the target layer and the semiconductor substrate are etched to form the gate when the third etch process is performed.

DESCRIPTION OF SPECIFIC EMBODIMENTS

Hereinafter, the embodiments of the present invention will be explained in more detail with reference to the accompanying drawings.

FIG. 1A to FIG. 1F are sectional views of a semiconductor device for illustrating a method of forming a micro pattern in a semiconductor device according to the first embodiment of the present invention, FIG. 1A to FIG. 1F show that the process of forming a micro pattern is performed on only a cell gate region.

Figure 1A:
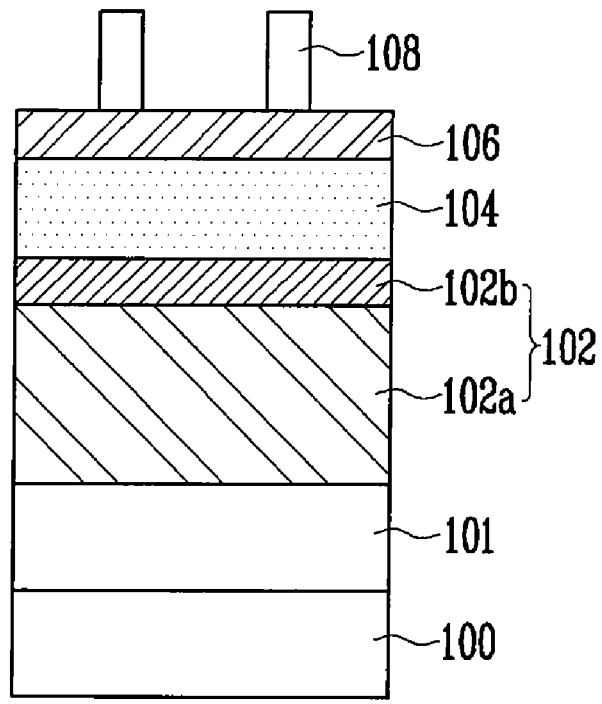
FIG. 1A to FIG. 1F are sectional views of a semiconductor device for illustrating a method of forming a micro pattern in a semiconductor device according to the first embodiment of the present invention.

Referring to FIG. 1A, an etching-subject (or target) layer 101, a hard mask layer 102 and a first sacrificial layer 104 are sequentially formed on a semiconductor substrate 100. At this time, the hard mask layer 102 has a stack structure consisting of an amorphous carbon layer 102a and a silicon oxynitride (SiON) layer 102b, and the first sacrificial layer 104 is formed from material such as polysilicon, silicon oxide ($SiO_2$), tungsten (W) or spin on glass. Here, the target layer 101 is formed of a layer such as an insulating layer, a conductive layer or an inter-insulating layer.

Subsequently, a bottom anti-reflective coating (BARC) 106 and photoresist patterns 108 are formed on the first sacrificial layer 104. At this time, the photoresist patterns 108 are formed such that a pitch between the photoresist patterns is twice as large as that between the micro patterns to be obtained in the final process.

Figure 1B:
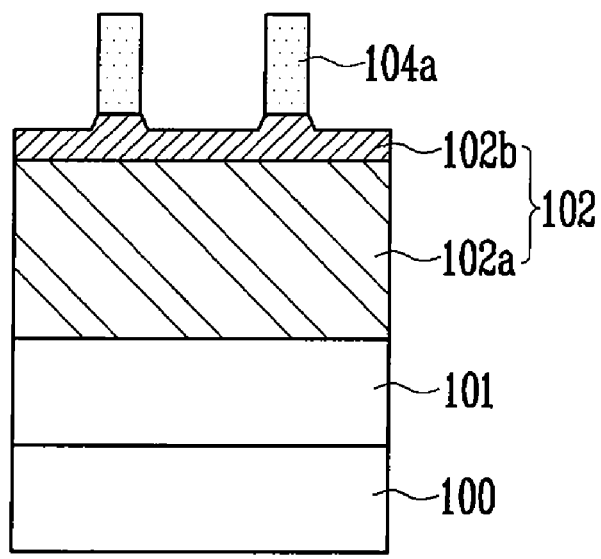

Referring to FIG. 1B, the bottom anti-reflective coating 106 and the first sacrificial layer 104 are etched by utilizing the photoresist patterns 108 as an etch mask to form first sacrificial patterns 104a. At this time, when an etch process is performed for etch the first sacrificial layer 104, an upper portion of the silicon oxynitride layer 102b constituting the hard mask layer 102 may be etched. The above process is performed for preventing a generation of a bridge in a subsequent process. The bridges are formed by having portions of the first sacrificial layer 104 remaining on the hard mask layer 102.

The photoresist patterns 108 are then removed. At this time, the bottom anti-reflective coating 106 may be removed when the photoresist patterns 108 are removed. The first sacrificial patterns 104a are formed such that a critical dimension (CD) of the first sacrificial pattern 104a is approximately half of a pitch between the micro patterns formed through the final process.

Figure 1C:
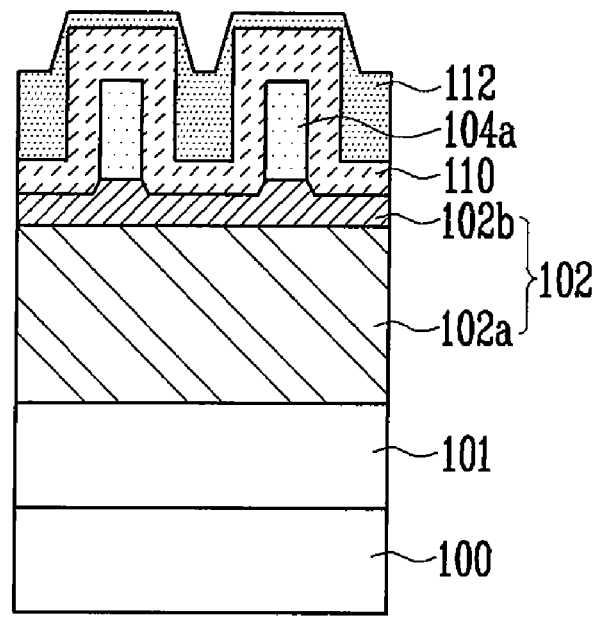

Referring to FIG. 1C, an insulating layer 110 is formed on the hard mask layer 102 and the first sacrificial patterns 104a. At this time, the insulating layer 110 may be formed from a material such as amorphous carbon, silicon oxide ($SiO_2$), a tungsten (W) or a SOG (spin on glass). Here, the amorphous carbon layer is formed as the insulating layer 110 because the amorphous carbon layer has an etchetch selectivity which is the same as that of a second sacrificial layer 112 (to be formed in a subsequent process) and of material utilized for forming the first sacrificial pattern 104a so that the amorphous carbon layer may be removed without damaging the first sacrificial patterns 104a during a subsequent process for removing the insulating layer 110. Accordingly, material having an etch selectivity with respect to the second sacrificial layer 112 and material utilized for forming the first sacrificial pattern 104a may be utilized for forming the insulating layer 110. The insulating layer is formed such that a thickness of the insulating layer 110 formed on a side surface of the first sacrificial pattern 104a is approximately half of the pitch of the micro patterns to be formed through the final process.

Then, the second sacrificial layer 112 is formed on the insulating layer 110 so as to fill a space between the first sacrificial patterns 104a. At this time, the second sacrificial layer 112 is formed from conductive material or insulative material. The second sacrificial layer may be formed of a SOG (spin on glass) layer having an excellent gap-fill property, an organic bottom anti-reflective coating containing silicon like a multi-functional hard mask layer, a silicon oxide ($SiO_2$) layer, a tungsten (W) layer or a polysilicon layer. Since SOG material contains a significant amount of impurities and moisture, if SOG material is utilized for forming the second sacrificial layer, a heat treatment process may be performed for removing the impurities and moisture after the second subsidiary layer has been formed.

Figure 1D:
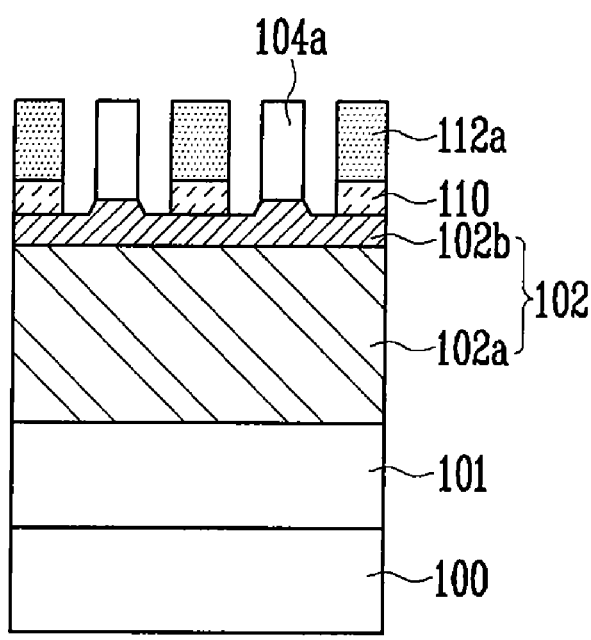

Referring to FIG. 1D, the second sacrificial layer 112 is etched until an upper side of the insulating layer 110 is exposed. At this time, the etch process is performed using an etch-back process. When the process for removing the second sacrificial layer 112 is performed, the top portion of the second sacrificial layer 112 that is surrounded by the insulating layer 110 is leveled with the top portion of the first sacrificial pattern 104a.

Subsequently, the insulating layer 110 exposed by the process for etching the second sacrificial layer 112 and the insulating layer 110 formed between the first sacrificial pattern 104a and the second sacrificial layer 112 are removed such that the insulating layer 110 remains on only a lower side of the second sacrificial layer 112 to form second sacrificial patterns 112a. The second sacrificial pattern and the first sacrificial pattern are formed in alternating manner. At this time, the insulating layer 110 is removed through a dry etch process utilizing oxygen plasma. The insulating layer 110 has an etchetch selectivity with respect to the second sacrificial layer 112 and material utilized for forming the first sacrificial pattern 104a when the process for etch the second sacrificial layer 112 and the process for removing the insulating layer 110 are performed. It is possible to obtain the desired pitch between the patterns by forming the second sacrificial pattern 112a between the first sacrificial patterns 104a as described above.

Figure 1E:
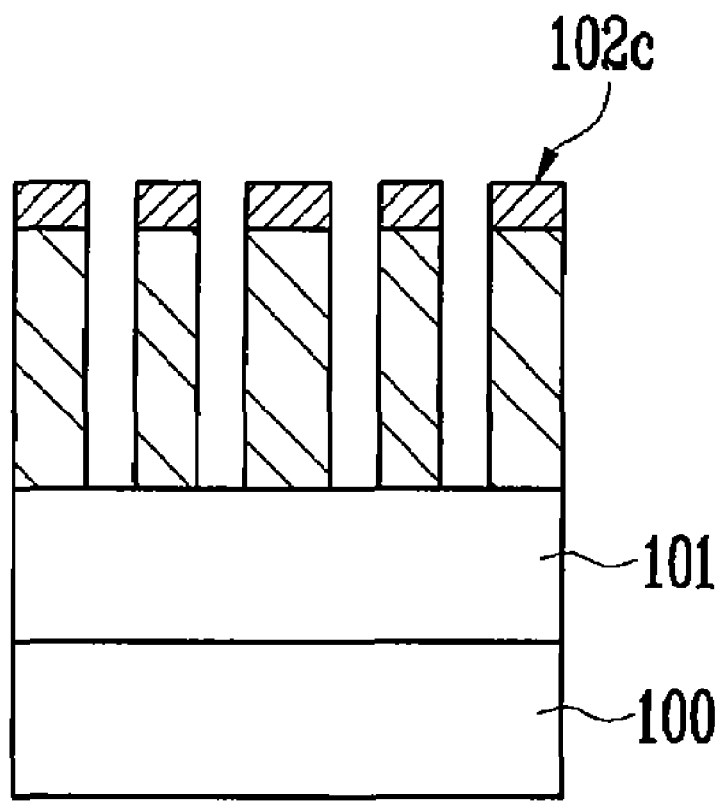

Referring to FIG. 1E, the hard mask layer 102 is etched by utilizing the first sacrificial pattern 104a and the second sacrificial pattern 112a as the etch mask to form the hard mask pattern 102c having the predetermined line and space. At this time, the hard mask layer 102 is etched through a dry etch process. The first sacrificial pattern 104a, the insulating layer 110 and the second sacrificial pattern 112a are removed to form a micro pattern consisting of the hard mask pattern 102c.

Figure 1F:
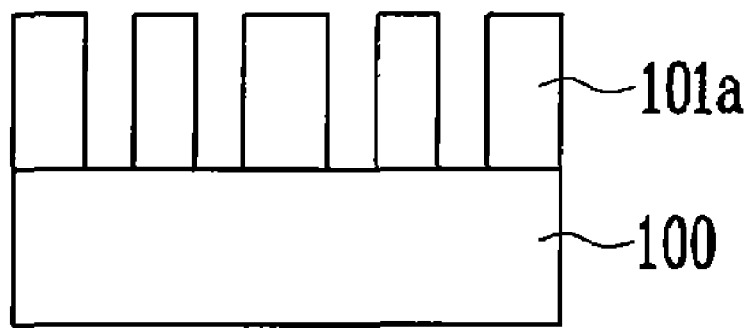

Referring to FIG. 1F, the target layer 101 etched by utilizing the hard mask pattern 102c having the predetermined line and space as the etch mask to form an etching-subject (or target) pattern 101a. The hard mask pattern 102c is removed.

As described above, the micro pattern is formed through only the processes of forming the first sacrificial pattern 104a and the second sacrificial pattern 112a so that the micro pattern having the desired critical dimension (CD) may be formed. Also, in the method according to the present invention, the conventional process for forming a spacer can be omitted, and so a process time can be reduced.

A method according to the present invention can be applied to a method of manufacturing a NAND flash memory device as follows.

FIG. 2A to FIG. 2H are sectional views of a semiconductor device for illustrating a method of forming a micro pattern in a semiconductor device according to the second embodiment of the present invention.

Figure 2A:
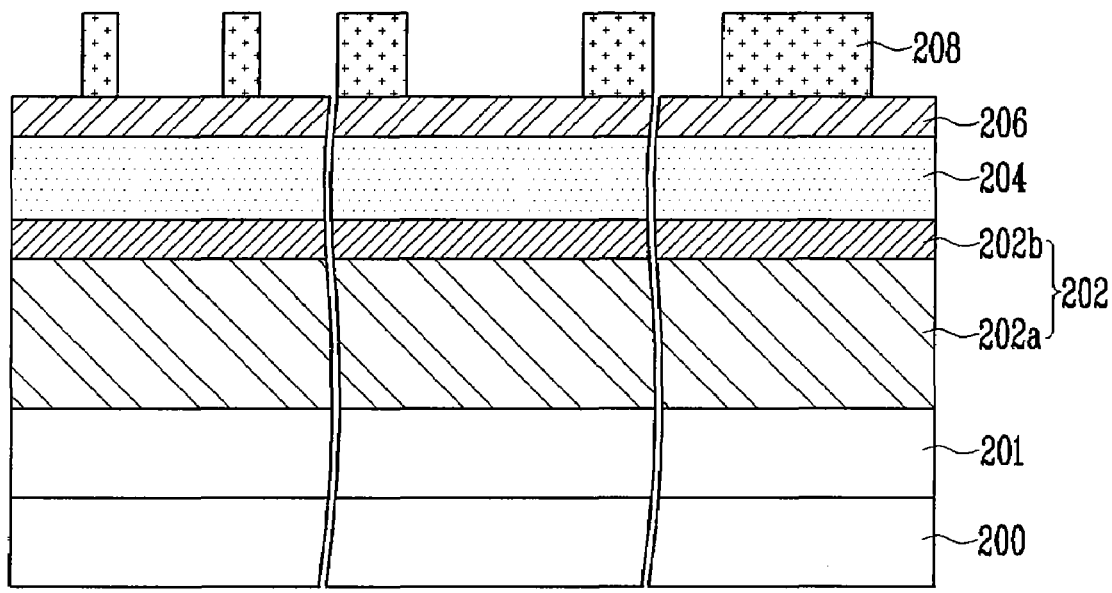
FIG. 2A to FIG. 2H are sectional views of a semiconductor device for illustrating a method of forming a micro pattern in a semiconductor device according to the second embodiment of the present invention.

Referring to FIG. 2A, an etch-subject (or target) layer 201 is formed on a semiconductor substrate 200 on which a cell gate region A, a selective transistor region B and a periphery circuit region C are defined. At this time, the target layer 201 is formed of a tungsten silicide (WSi$_x$) layer, and a stack structure consisting of a tunnel insulating layer, a first conductive layer for a floating gate, a dielectric layer and a second conductive layer for a control gate is formed between the tungsten silicide (WSi$_x$) layer and the semiconductor substrate 200. A hard mask layer 202 and a first sacrificial layer 204 are sequentially formed on the target layer 210. At this time, the hard mask layer 202 has a stack structure consisting of an amorphous carbon layer 202a and a silicon oxynitride layer 202b, and the first sacrificial layer 204 is formed from material such as polysilicon, silicon oxide (SiO$_2$,), tungsten (W) or SOG (spin on glass).

Subsequently, a bottom anti-reflective coating 206 and first photoresist patterns 208 are formed on the first sacrificial layer 204. At this time, the photoresist patterns 208 are formed such that a pitch between the photoresist patterns is twice as large as that between gate lines to be formed in the final process.

Figure 2B:
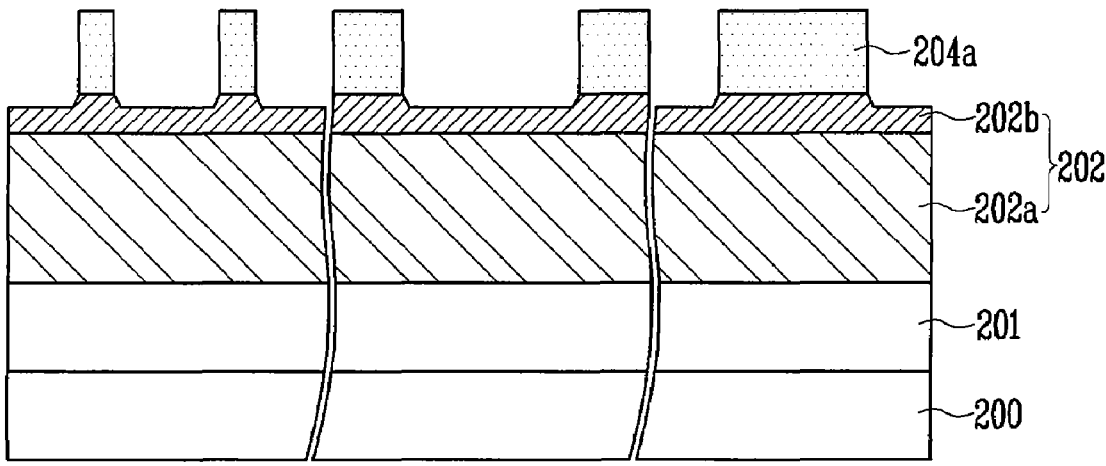

Referring to FIG. 2B, the bottom anti-reflective coating 206 and the first sacrificial layer 204 are etched by utilizing the first photoresist patterns 208 as an etch mask to form first sacrificial patterns 204a. At this time, when an etch process is formed for etching the first sacrificial layer 204, an upper portion of the silicon oxynitride layer 202b constituting the hard mask layer 202 may be excessively etched. The above process is performed for preventing a generation of a bridge in a subsequent process caused by a portion of the first sacrificial layer 204 remaining on the hard mask layer 202.

The first photoresist patterns 208 are then removed. At this time, the bottom anti-reflective coating 206 may be removed when the first photoresist patterns 208 are removed. The first sacrificial patterns 204a are formed such that a critical dimension (CD) of the first sacrificial pattern 204a is approximately half of the pitch of the micro patterns formed through the final process.

Figure 2C:
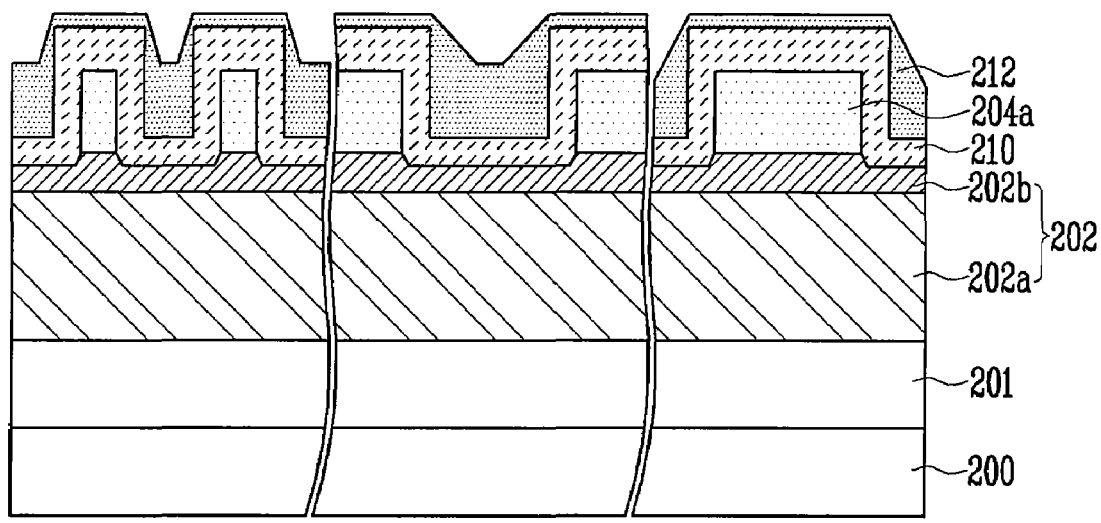

Referring to FIG. 2C, an insulating layer 210 is formed on the hard mask layer 202 and the first sacrificial patterns 204a. At this time, the insulating layer 210 may be formed from material such as amorphous carbon, silicon oxide (SiO$_2$), tungsten (W) layer or SOG (spin on glass). Here, the amorphous carbon layer is formed as the insulating layer 210 because the amorphous carbon layer has an etch selectivity which is the same as that of the material constituting a second sacrificial layer 212 (to be formed in a subsequent process) and the first sacrificial pattern 204a so that the amorphous carbon layer may be removed without damaging the first sacrificial patterns 204a during the subsequent process for removing the insulating layer 210. Accordingly, material having an etch selectivity with respect to the second sacrificial layer 212 and material utilized for forming the first sacrificial pattern 204a may be utilized for forming the insulating layer 210. The insulating layer is formed such that a thickness of the insulating layer 210 formed on a side surface of the first sacrificial pattern 204a is approximately half of the pitch of the micro patterns to be formed through the final process.

Then, the second sacrificial layer 212 is formed on the insulating layer 110 so as to fill a space between the first sacrificial patterns 204a. At this time, the second sacrificial layer 212 is formed from conductive material or insulative material. The second sacrificial layer may be formed of a SOG (spin on glass) layer having an excellent gap-fill property, an organic bottom anti-reflective coating containing silicon like a multi-functional hard mask layer, a silicon oxide (SiO$_2$) layer, a tungsten (W) layer or a polysilicon layer. Since SOG material contains plenty of impurities and moisture, if SOG material is utilized for forming the second sacrificial layer, a heat treatment process may be performed for removing impurities and moisture after a deposition process.

Figure 2D:
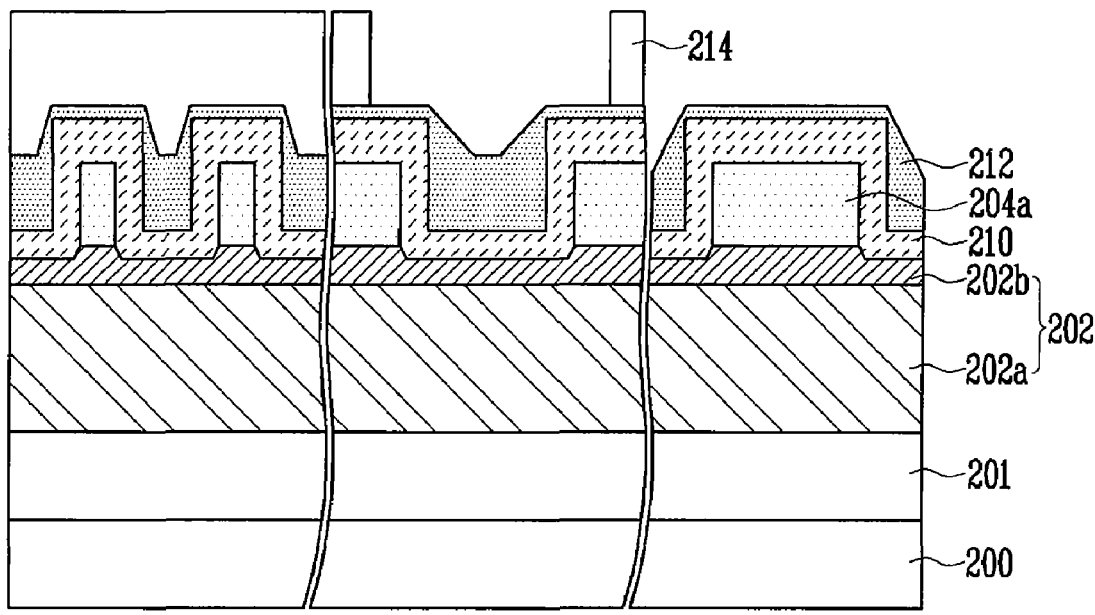

Referring to FIG. 2D, photoresist patterns 214 are formed on the second sacrificial layer 212 in the cell gate region A to open the selective transistor region B and the peripheral region C.

Figure 2E:
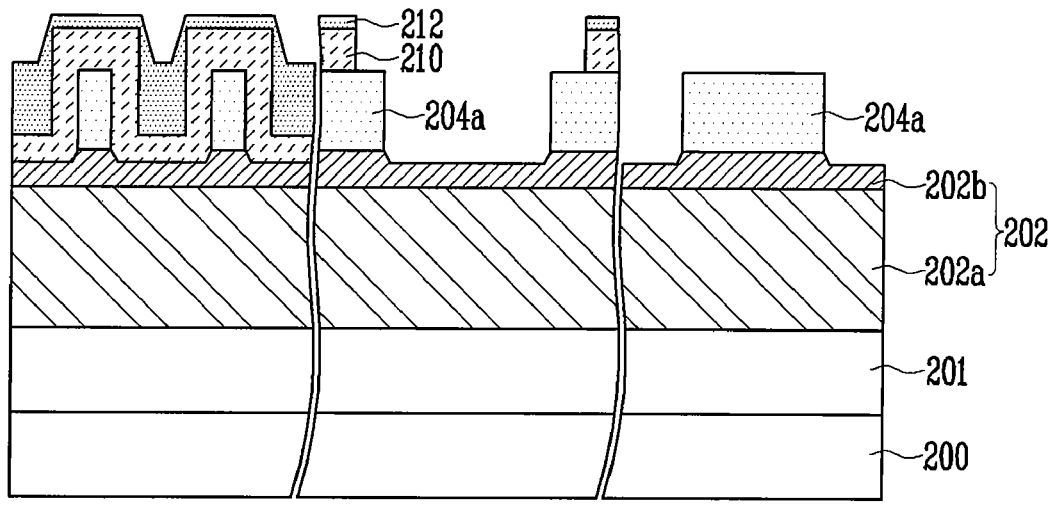

Referring to FIG. 2E, the second sacrificial layer 212 and the insulating layer 210 formed in the selective transistor region B and the peripheral region C are etched by utilizing the second photoresist patterns 214 as the etch mask. At this time, the second sacrificial layer 212 is removed through a dry etch process utilizing the insulating layer 210 as an etch stop layer for preventing an upper portion of the silicon oxynitride (SiON) layer 202b constituting the hard mask layer 201 from being damaged when the etch process is performed, and the insulating layer 210 is then removed through a dry etch process utilizing the silicon oxynitride (SiON) layer 202b as an etch stop layer. The second photoresist patterns 214 are removed.

Figure 2F:
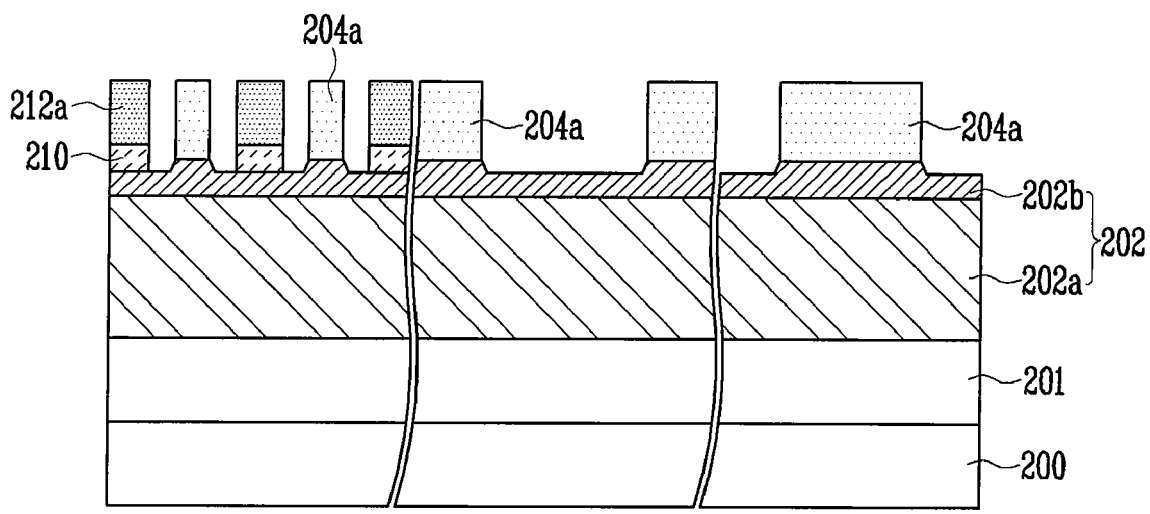

Referring to FIG. 2F, the second sacrificial layer 212 formed in the cell gate region A is etched through an etch process until an upper side of the insulating layer 210 is exposed. At this time, the etch process is performed using an etch-back process. When the process for etching the second sacrificial layer 212 formed in the cell gate region A is performed, the top portion of the second sacrificial layer 212 that surround by the insulating layer 210 is leveled with the first sacrificial pattern 204a, and when the process for etching the second sacrificial layer 212 formed in the cell gate region A is performed, the second sacrificial layer 212 formed in the selective transistor region B is also removed until a portion of the insulating layer 210 is exposed.

Subsequently, the insulating layer 210 exposed through the process for etching the second sacrificial layer 212 in the cell gate region A and the insulating layer 210 formed between the first sacrificial pattern 204a and the second sacrificial layer 212 are removed such that the insulating layer 210 remains on only a lower side of the second sacrificial layer 212 to form second sacrificial patterns 212a in the cell gate region A. At this time, the insulating layer 210 is removed through a dry etch process utilizing oxygen plasma. Here, the insulating layer 210 has an etch selectivity with respect to the second sacrificial layer 212 and material utilized for forming the first sacrificial pattern 204a when the process for etching the second sacrificial layer 212 and the process for removing the insulating layer 210 are performed. When the process for removing the insulating layer 210 formed in the cell gate region A is performed, the insulating layer 210 remaining in the selective transistor region B is also removed. It is possible to obtain the desired pitch between the patterns by forming the second sacrificial pattern 212a between the first sacrificial patterns 204a as described above.

Figure 2G:
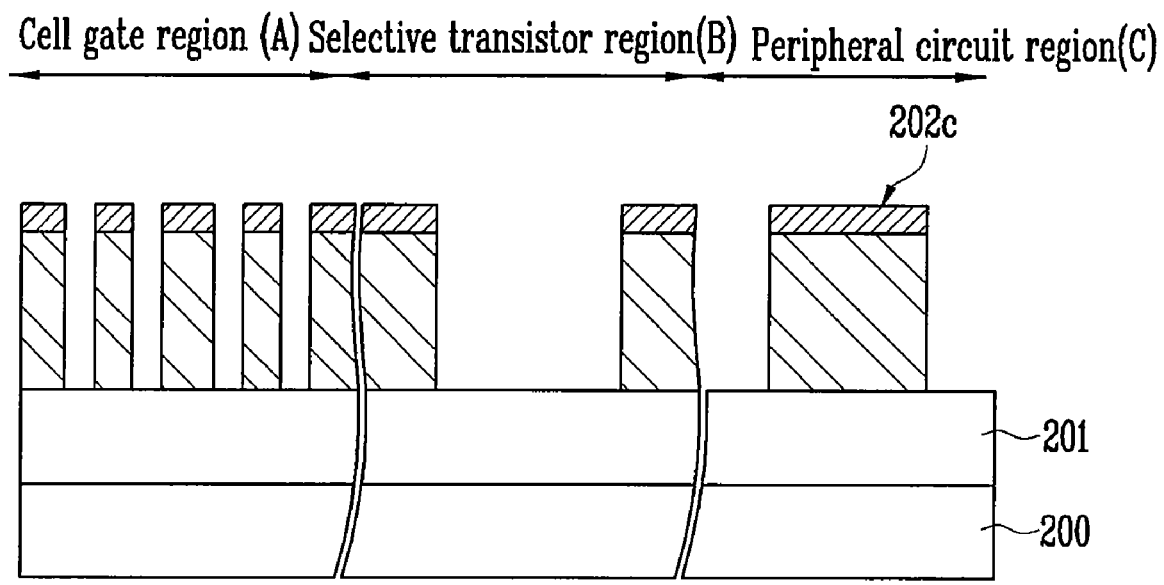

Referring to FIG. 2G, the hard mask layer 202 is etched by utilizing the first sacrificial pattern 204a and the second sacrificial pattern 212a as the etch mask to form the hard mask pattern 202c having the predetermined line and space. At this time, the hard mask layer 202 is removed through a dry etch process. The first sacrificial pattern 204a, the insulating layer 210 and the second sacrificial pattern 212a are moved to form a micro pattern consisting of the hard mask pattern 202c.

Figure 2H:
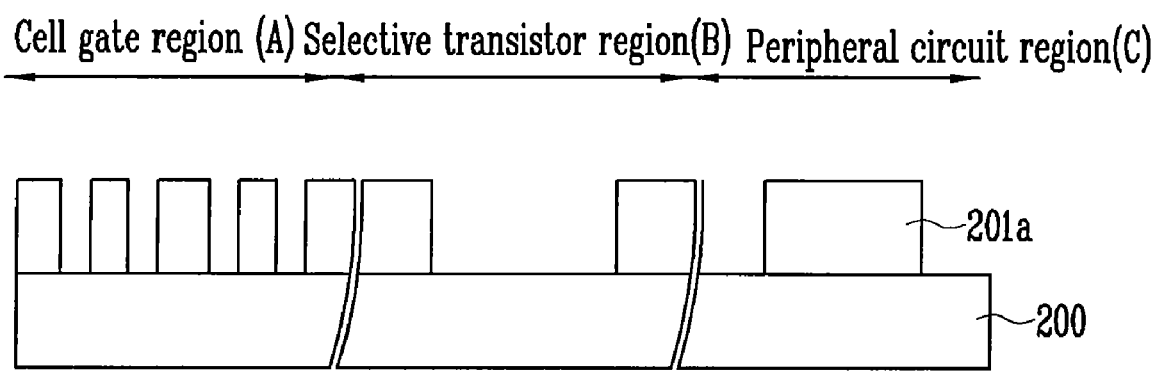

Referring to FIG. 2H, the target layer 201 is etched by utilizing the hard mask pattern 202c having the predetermined line and space as the etch mask to form an -target pattern 201a. At this time, when the target layer 201 is etched, the tunnel insulating layer formed between the target layer 201 and the semiconductor substrate 200, the first conductive layer for the floating gate, the dielectric layer and the second conductive layer for the control gate are simultaneously etched to form the gate. The hard mask pattern 202c is removed.

As described above, the micro pattern is formed through only the processes of forming the first sacrificial pattern 204a and the second sacrificial pattern 212a so that the micro pattern having the desired critical dimension (CD) may be formed. Also, in the method according to the present invention, the conventional process for forming a spacer can be omitted, and so a process time can be reduced. In addition, when the process for etching the second sacrificial layer 212 and the insulating layer 210 formed in the selective transistor region B and the periphery circuit region C is performed, it is possible to inhibit the first sacrificial pattern 204a and an upper portion of the silicon oxynitride layer 202b constituting the hard mask layer 202 from being damaged because the insulating layer 210 having the etch selectivity with respect to the second sacrificial layer 212 and material constituting the first sacrificial pattern 204a is formed below the second sacrificial layer 212.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The present invention as described above has the following advantages:

First, the micro pattern is formed through only the processes of forming the first sacrificial pattern and the second sacrificial pattern, and so the micro pattern having the desired critical dimension (CD) may be formed.

Second, since the conventional process for forming a spacer can be omitted, a process time can be reduced.

Third, when the process for etching the second sacrificial layer and the insulating layer formed in the selective transistor region and the periphery circuit region is performed, it is possible to inhibit the first sacrificial pattern and an upper portion of the silicon oxynitride layer constituting the hard mask layer from being damaged because the insulating layer having the etch selectivity with respect to the second sacrificial layer and material constituting the first sacrificial pattern is formed below the second sacrificial layer.

What is claimed is:

1. A method of forming a fine pattern in a semiconductor device, the method comprising:
   forming a target layer, a hard mask layer and first sacrificial patterns over a semiconductor substrate;
   forming an insulating layer and a second sacrificial layer over the hard mask layer and the first sacrificial patterns;
   performing a first etch process so as to allow the second sacrificial layer to remain over the insulating layer between the first sacrificial patterns for forming second sacrificial patterns;
   removing the insulating layer provided over the first sacrificial patterns and between the first and second sacrificial patterns;
   etching the hard mask layer through a second etch process utilizing the first and second sacrificial patterns as an etch mask to form a hard mask pattern; and
   etching the target layer through a third etch process utilizing the hard mask pattern as an etch mask.

2. The method of claim 1, wherein the target layer is formed of an insulating layer, a conductive layer or an inter-insulating layer.

3. The method of claim 1, wherein the hard mask layer has a stack structure including an amorphous carbon layer and a silicon oxynitride (SiON) layer.

4. The method of claim 1, wherein each first sacrificial pattern is formed of a polysilicon layer, a silicon oxide ($SiO_2$,) layer, a tungsten layer or a SOG (spin on glass) layer.

5. The method of claim 1, wherein each first sacrificial pattern has a critical dimension that is approximately half of a pitch between the fine patterns formed through the final process.

6. The method of claim 1, wherein the insulating layer is formed from amorphous carbon layer, silicon oxide ($SiO_2$), a tungsten (W) or a SOG (spin on glass).

7. The method of claim 1, wherein the insulating layer is formed from material having an etch selectivity with respect to material utilized for forming the second sacrificial layer and the first sacrificial patterns.

8. The method of claim 1, wherein the insulating layer deposited on a side surface of each first sacrificial pattern has a thickness that is approximately half of a pitch between the fine patterns formed through the final process.

9. The method of claim 1, wherein the second sacrificial layer is formed from conductive material or insulative material.

10. The method of claim 1, wherein the second sacrificial layer is formed of a SOG (spin on glass) layer, an organic bottom anti-reflective coating containing silicon such as a multi-functional hard mask layer, a silicon oxide ($SiO_2$) layer, a tungsten (W) layer or a polysilicon layer.

11. The method of claim 10, further comprising performing a heat treatment process after forming the deposition process if SOG material is utilized.

12. The method of claim 1, wherein the second sacrificial layer is etched through the etchback process.

13. The method of claim 1, wherein the second sacrificial patterns are leveled with the first sacrificial patterns when the first etch process is performed.

14. The method of claim 1, wherein the insulating layer is removed through a dry etch process utilizing oxygen ($O_2$) plasma.

15. The method of claim 1, wherein the insulating layer has an etch selectivity with respect to material utilized for forming the first sacrificial patterns and the second sacrificial layer when the first etch process and the process for removing the insulating layer are performed.

16. The method of claim 1, wherein each second sacrificial pattern is formed between adjacent first sacrificial patterns.

17. The method of claim 1, wherein the second etch process is a dry etch process.

* * * * *